United States Patent
Adamec

(10) Patent No.: US 7,928,403 B2
(45) Date of Patent: Apr. 19, 2011

(54) MULTIPLE LENS ASSEMBLY AND CHARGED PARTICLE BEAM DEVICE COMPRISING THE SAME

(75) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 251 days.

(21) Appl. No.: 11/323,017

(22) Filed: Dec. 30, 2005

(65) Prior Publication Data

US 2006/0151713 A1    Jul. 13, 2006

(30) Foreign Application Priority Data

Dec. 30, 2004    (EP) ..................... 04031042

(51) Int. Cl.
*H01J 37/26*    (2006.01)
(52) U.S. Cl. ............ 250/396 R; 250/310; 250/311
(58) Field of Classification Search .......... 250/396 R
See application file for complete search history.

(56) References Cited

U.S. PATENT DOCUMENTS

| 2,441,850 | A | 5/1948 | Smith et al. |
| 4,209,698 | A | 6/1980 | Hoppe |
| 6,038,018 | A | 3/2000 | Yamazaki et al. |
| 6,437,352 | B1 | 8/2002 | Gordon |
| 6,627,890 | B2 | 9/2003 | Lanio |
| 6,812,462 | B1* | 11/2004 | Toth et al. ............ 250/310 |
| 2002/0170675 | A1 | 11/2002 | Libby et al. |
| 2003/0102430 | A1 | 6/2003 | Kimura et al. |
| 2004/0105160 | A1* | 6/2004 | Kienzle et al. ........ 359/619 |

FOREIGN PATENT DOCUMENTS

GB    1 421 159    11/1918
JP    02 061 952    8/1988

OTHER PUBLICATIONS

European Search Report dated Jun. 28, 2006 for EP Application No. 04031042.7.

* cited by examiner

*Primary Examiner* — Phillip A Johnston
(74) *Attorney, Agent, or Firm* — Patterson & Sheridan, LLP

(57) ABSTRACT

The invention provides a multiple-lens assembly 1 for a charged particle beam device which comprises at least two lens sub units 2, each sub unit having an optical axis 3, wherein at least two of the optical axes of the lens sub units are inclined to each other. Further, the invention provides a charged particle beam device which comprises at least one multiple-lens assembly and a method for operating a charged particle beam device.

29 Claims, 12 Drawing Sheets

MULTIPLE LENS ASSEMBLY AND CHARGED PARTICLE BEAM DEVICE COMPRISING THE SAME

CROSS-REFERENCE TO RELATED APPLICATIONS

This application claims benefit of co-pending European patent application Serial No. EP 04031042.7 filed Dec. 30, 2004, and is herein incorporated by reference in its entirety.

FIELD OF THE INVENTION

The invention relates to charged particle beam device optics. The invention further relates to charged particle beam devices for inspection system applications, testing system applications, lithography system applications and the like. The invention relates particularly to charged particle beam devices providing a plurality of optical axes. It also relates to methods of operation thereof.

BACKGROUND OF THE INVENTION

Lenses in general are used in many applications such as charged particle beam apparatuses which have many functions in a plurality of industrial fields, including, but not limited to, inspection of semiconductor devices during manufacturing, exposure systems for lithography, detecting devices and testing systems. A conventional lens is characterized by its focal length (or, as sometimes otherwise called, focal width or focal distance) and further by its optical axis. The focal length of lenses used in charged particle beam devices results essentially from the voltage or current applied which may be changed during operation. The optical axis may be understood as a main property of a lens used for charged particle beams such as an electron beam or an ion beam.

In many applications, the optical axes of the lenses applied coincide with the optical path of the beam. If the beam is used for analyzing a surface, for instance in a charged particle beam device, there are three techniques known in the state of the art to tilt the beam against the surface to be analyzed.

The first method is to tilt the specimen table in order to tilt the specimen fixed thereto. This way, the resulting angle between beam and specimen surface can be varied. However, there are also some disadvantages: The specimen table must be exactly tiltable; the specimen must be fixed to the table if the tilt angle exceeds a certain degree, otherwise it will slide; the focus of the beam has to be adjusted constantly if following up and down the tilted specimen; etc.

The second method is to leave the specimen table fixed but to tilt the charged particle beam device. That is, as in the previous case, a different angle between beam and surface results from mechanical tilting. The disadvantages are that there needs to be an exactly tiltable mechanical arrangement for tilting the device. Further, if the beam is tilted slightly further, the specimen plane is no longer in alignment with the optical width. Therefore, for every further tilting the focal width has to be adjusted again. This complicates the analysis of the specimen.

The third method is to leave both the specimen table and the beam device fixed. In this case, some deflection assembly is incorporated in the device in order to vary the angle between the beam and the specimen plane. There are, roughly spoken, the following three possibilities:

Firstly, a deflector is placed downstream of the objective lens. Thus, the beam can theoretically pass through the objective lens on its optical axis. However, the resolution suffers from the larger distance necessary between the objective lens and the specimen.

Secondly, a deflector is placed upstream of the objective lens. The deflected beam, however, passes the objective lens off-axially due to the deflection. Thus, this arrangement suffers from aberration.

Thirdly, at least two deflectors are placed upstream of the objective lens whereby the deflection orientation of at least two deflectors are opposite to one another. Hence, it is theoretically possible to deflect the beam such that it passes the objective lens in the middle. However, the beam still does not travel along the optical axis. This again may result in aberration. Furthermore, the optics is difficult to adjust.

It is accordingly an object of the present invention to provide a lens assembly for a charged particle beam device which overcomes at least some of the problems in the state of the art. Furthermore, it is an object of the present invention to provide a charged particle beam device which allows an improved three-dimensional analysis of a specimen surface. Furthermore, it is an object of the present invention to provide a method for operating a charged particle beam device that overcomes at least some of the problems in the state of the art.

SUMMARY OF THE INVENTION

According to aspects of the present invention, a multiple lens assembly according to independent claim 1, a charged particle beam device according to claim 13 and a method of operating a charged particle beam according to claim 28 are provided. The multiple lens assembly allows the focusing of beams along different optical axes.

Further advantages, features, aspects and details of the invention are evident from the dependent claims, the description and the accompanying drawings.

According to one aspect of the present invention, the multiple lens assembly for charged particle beam devices comprises at least two lens sub units. Each sub unit has an optical axis, wherein at least two of the optical axes of the lens sub units are inclined, that is, they are not parallel to each other.

Making use of this aspect, the multiple lens assembly can be used in all charged particle beam device applications where it is helpful or necessary to guide a beam through one of a plurality of sub units whereby the beam direction differs depending on the sub unit addressed. This aspect may particularly be desired in three dimensional surface analysis applications where it is necessary for the charged particle beam to impinge on the surface at least two different angles. Making use of this aspect, there is no need for tilting the specimen or the charged particle beam device. Furthermore, no aberrations due to off-axially propagation are introduced.

In a typical embodiment of the present invention, the beams passing through each of the lens sub units stems from the same charged particle beam source.

In another typical embodiment of the present invention, the sub units are adapted to receive the beam from a deflector which causes an incoming beam to be propagating towards one of the at least two sub units.

In a typical embodiment of the present invention, the multiple assembly is a one-piece assembly. The term "one-piece" in the context of the assembly indicates that all essential parts of the assembly, particularly all lens sub units, cohere in such a way that they are not supposed to be separated. The one-piece arrangement may indeed be such that the separation of the sub units would lead to the destruction of the lens assembly.

It is another aspect of the present invention that the multiple lens assemblies as described herein are used in charged particle beam devices.

In one embodiment, the beam current at a given time is deflected by the deflection system substantially to one lens assembly sub unit. If the beam consists e.g. of electrons, the beam current is defined as number of electrons passing per second×the elementary charge (approx. $1,60 \cdot 10^{-19}$ C). "Substantially" in this context means that no current, or a current of a comparatively extremely small amount of charged particles, flows through other sub units. That is, if there are no aperture units between deflection system and sub units, the beam current through one sub unit is substantially identical to the beam current through the deflection system whereas there is no beam current through the other sub units. For the analysis of a specimen with the help of a multiple lens assembly, the deflection is changed from time to time in order to deflect the beam to different sub units at different times. Thus, the specimen is impinged at different angles.

In another aspect of the present invention, the charged particle beam device comprises a detection system (or assembly) suitable for detection of the reflected or transmitted charged particle beam. The detection assembly could be only one detection unit capable of detecting the reflected or transmitted beam independently of which sub unit the beam was deflected to. Alternatively, it is possible to provide several detection units whereby each detection unit corresponds to at least one lens sub unit. The position of the detection assembly may be between emitter and deflector, between deflector and multiple lens assembly or between multiple lens assembly and specimen.

In another aspect, the present invention provides a method for operating a charged particle beam device. The method comprises the following steps:
- providing a multiple lens assembly with at least two sub units, each having an optical axis, wherein at least two of the optical axes of the two sub units are inclined to each other;
- emitting a charged particle beam with a charged particle emitter;
- deflecting the charged particle beam with a deflection system so that the charged particle beam is directed along the optical axis of at least one of the at least two lens sub units, whereby the degree of deflection is chosen from at least two different values; and
- scanning the specimen with the charged particle beam which passed through the first and the second lens sub unit.

The method can be applied in all analytical applications. Making use of this method, a specimen can be three-dimensionally imaged without tilting the specimen or the charged particle beam device. Several tilt-angles can be chosen without the necessity of an off-axis beam path. Thereby, aberrations can be reduced.

According to a typical method of the present invention, the charged particles are deflected such that the propagation direction of the particles after deflection is substantially identical for all particles. Hence, at a given time $t_1$, the deflected beam propagates only through one of the at least two sub units. At given time $t_2$, the deflected beam propagates trough another one of the at least two sub units. This embodiment is advantageous in that essentially the whole energy given in the charged particle beam leaving the charged particle beam emitter can be used for inspecting a single spot on a specimen, whereas no need occurs to change the arrangement in order to inspect another spot on the specimen.

According to another embodiment of the present invention, the charged particle beam is split into several charged particle beams, each propagating into a different direction towards a separate lens sub unit. This embodiment is advantageous in that different spots on a specimen can be examined contemporaneously.

It is a typical method of the present invention that the specimen is analyzed using at least two different angles between the specimen plane and the beam, whereby the optical axes of the sub units are inclined by an angle of at least 5°, preferably at least 10°. In three dimensional imaging applications, the angle between the optical axes is typically between 10° and 25°, more typically between 10° and 15°. For example, one beam impinges the specimen at 50 or less and the other beam, which passed through another sub unit, impinges the specimen at 15°, 20° or even 25°.

In applications for analyzing vertical structures, the angle between the optical axes of the sub units is even higher. In those cases typical angles are 35°, 40°, 45° or even 60°. It will be clear for a person skilled in the art that every angle between these values is possible.

Preferably, the focal lengths of all sub units are adjusted such that at least one focal length of the lens sub units differs from the other. In particular, typically the foci of all lens sub units lie in one plane which is typically the specimen plane. For the analysis of a specimen, it is desirable if the foci of all lens sub units lie in one plane.

Additionally, due to the fact that best analyzing performance is achieved with the lenses as close to the specimen as possible, embodiments of the present invention are typical which have the focal lengths similar or identical to all sub units. This is particularly true with applications having two sub units. Similar in this context means that the maximal differences are about 15-20% in relation to the focal length.

In a typical method for operating the charged particle beam, additional correction lenses are operated. The operation comprises the vernier adjustment of the focal width. Furthermore, in those embodiments where the electrostatic, magnetic or electromagnetic field strength may be adjusted by the multiple lens assembly uniformly for all sub units, the operation of the correction lenses comprises the adjustment of different focal distances for the sub units. That is, although there is one similar main field causing the lens main effect in all lens assembly sub units, additional superposing fields in each sub unit may be generated and adequately adjusted by operating these additional lenses. The correction lenses are typically placed between the respective lens sub unit and the specimen plane Another aspect of the present invention is a method for three-dimensional imaging of a specimen. In order to do so, a specimen is imaged under a first angle to obtain a first image and the specimen is imaged under a second angle to obtain a second image. If desired, further imaging under further angles is possible. The measured data is processed to produce a three-dimensional picture of the specimen surface.

BRIEF DESCRIPTION OF THE DRAWINGS

Some of the above indicated, and other more detailed aspects of the invention, will be described in the following description and partially illustrated with reference to the figures. Therein.

DETAILED DESCRIPTION OF THE DRAWINGS

Figure 1A:
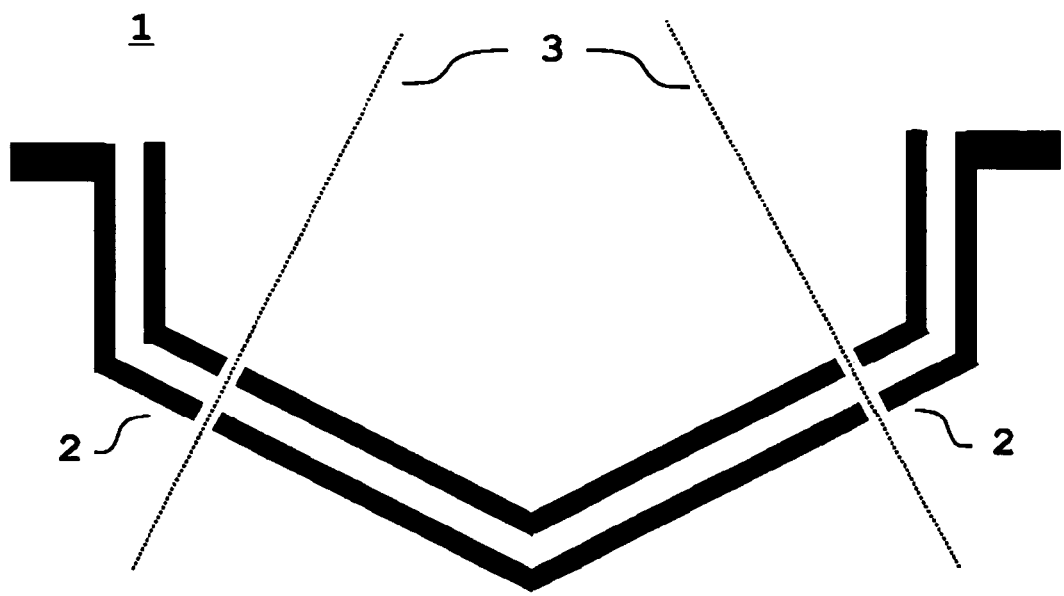
FIG. 1a shows a schematic view of a first embodiment of the multiple lens with two electrostatic lens sub units.

Within the following description of the drawings, the same reference numbers refer to the same components. Generally, only the differences with respect to the individual embodiments are described. It is to be understood that in the drawings only those elements are shown which are essential for the present invention or help in understanding the invention.

In the following, the use of the multiple lens assembly according to the present invention is shown within a charged particle beam device. Without limiting the scope of protection of the present application, in the following the charged particle beam device or components thereof might especially be utilized for inspection or lithography. The present invention can still be applied for apparatuses and components using other sources of charged particles and/or other secondary and/or backscattered charged particles to obtain a specimen image.

The multiple lenses according to the invention are either depicted as an electrostatic lens or as a magnetic lens in the figures. It is well understood that in all embodiments shown, electrostatic, magnetic or compound electrostatic magnetic lenses could be applied.

Figure 1B:
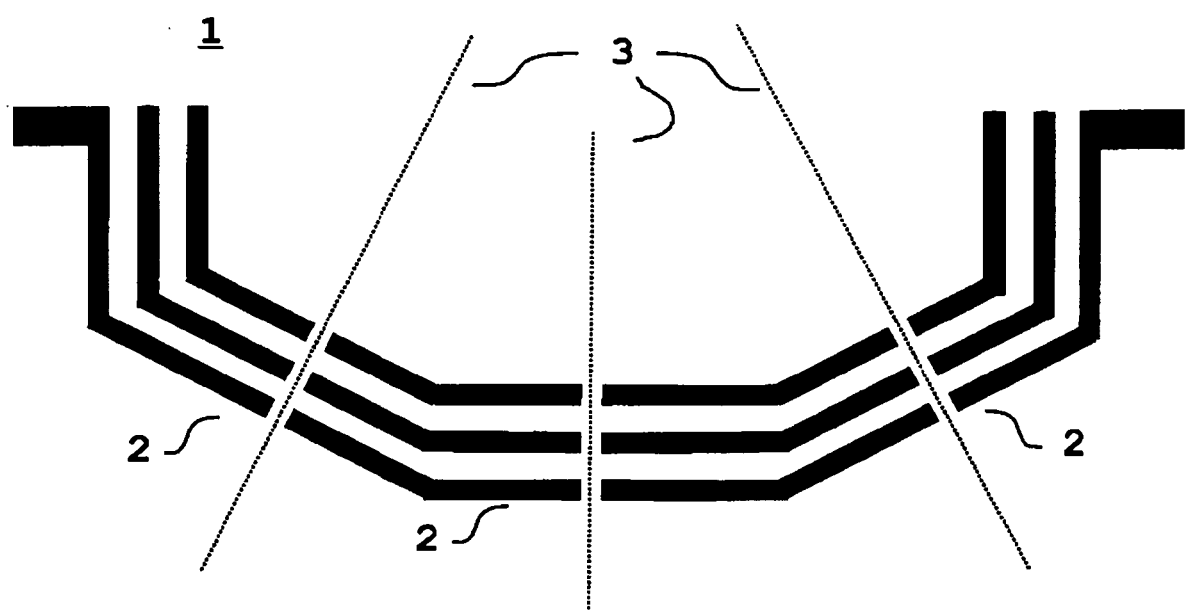
FIG. 1b shows a schematic view of a second embodiment of the multiple lens with three electrostatic lens sub units.

FIGS. 1a and 1b show two embodiments of the multiple lens assembly according to the present invention. The multiple lens 1 in FIG. 1a comprises two sub units 2 and the multiple lens 1 in FIG. 1b comprises three sub units 2, each of which has an optical axis 3. The lens effect of the sub units is carried out by exploiting electrostatic interaction between the charged particle beam and the sub units, i.e. the multiple lenses of FIG. 1a and FIG. 1b are electrostatic lenses. The multiple lens assemblies shown in FIG. 1a and FIG. 1b are one-piece assemblies, i.e., the sub units are different branches of a continuous assembly. Thus, there is no need to connect each lens sub unit individually which simplifies the production of the multiple lens assemblies, the adjusting process and the operating of the lens assembly. The lens assembly as shown in FIG. 1a comprises two electrodes whereas the lens assembly as shown in FIG. 1b comprises three electrodes. It will be clear for a person skilled in the art that an arbitrary number of electrodes is possible as long as the lens assembly meets the requirements of the specific application. Furthermore, it will be clear for a person skilled in the art that optionally a magnetic lens or a compound electrostatic magnetic lens could be used instead of the electrostatic lenses shown.

In general, the optical axes of the lens sub units according to the present invention are inclined preferably by an angle of between 30° and 60° in vertical structure analyzing application and between 10° and 25° in three-dimensional imaging applications. These values refer in general to the angle between the respective outermost sub units. For example, the angle between the optical axes of the two sub units of a multiple lens assembly with two sub units used in three-dimensional imaging could be 10°. If, however, a multiple lens assembly was used which has three lens sub units, and the angle between the optical axes between the outermost sub units is 10°, the angle between the optical axis of the middle sub unit and the two outermost lens sub units is 5°, respectively. That is, for instance, one beam impinges the specimen at 5°, the beam passing through the middle sub unit impinges the specimen at 10° and the beam passing through the third sub unit impinges the specimen at 15°.

Preferably the lens assembly according to the present invention is electrostatic, magnetic or compound magnetic electrostatic. Thus, the lens effect is realized by exploiting electrostatic, magnetic or electromagnetic interactions.

Figure 2:
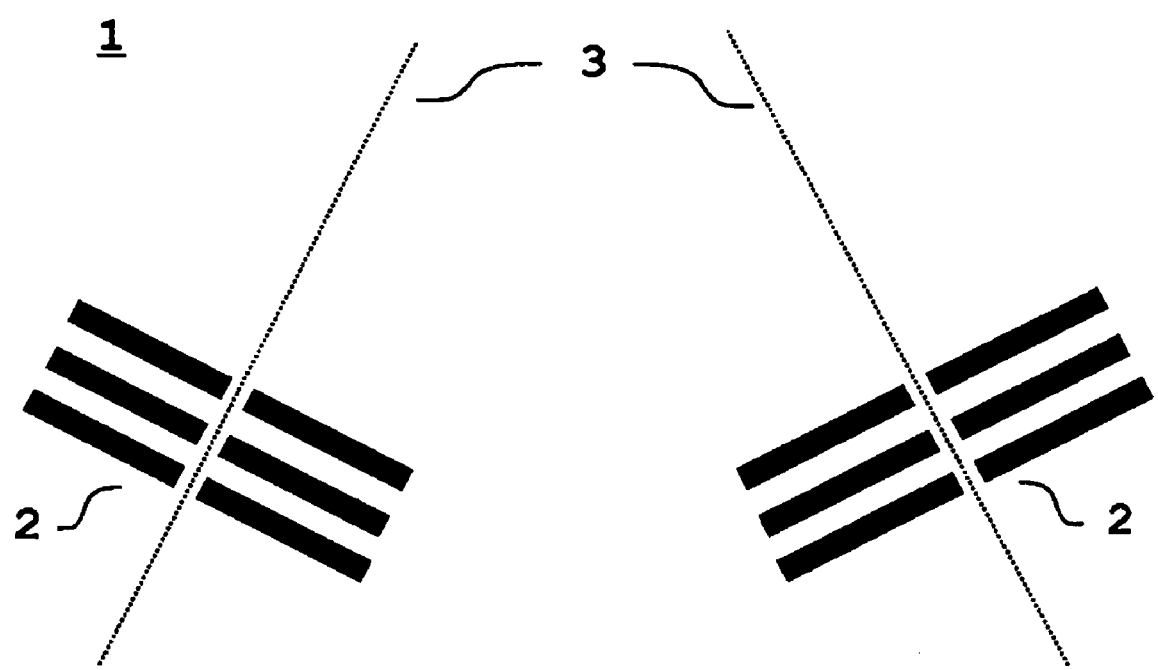
FIG. 2 shows a schematic view of a third embodiment of the multiple lens with two separate electrostatic lens sub units.

FIG. 2 shows another embodiment of the multiple lenses according to the present invention. The multiple-lens assembly 1 comprises two electrostatic lens sub units 2, each of which has an optical axis 3. The lens assembly is separable, i.e., each lens sub unit 2 refers to an individual electrostatic lens. The advantage of this embodiment is an independent control, particularly an independent adjustment of the voltage provided in each sub unit 2.

In a further embodiment (not shown), the one-piece assembly of FIG. 1a or FIG. 1b can comprise electrically isolated sub units. Thereby, an individual control may also be utilized for a one-piece assembly.

The single lens sub units may be individually produced for production reasons and afterwards physically linked to each other, thus constituting a multiple lens assembly. In this case, the single sub units can be separated from each other without destroying the lenses.

In an embodiment of the present invention, the sub units are arranged symmetrically to an axis. This axis may be a mathematical symmetry axis which does not correspond to any of the optical axis of the lens sub units. An exemplary embodiment of this arrangement would be shown in FIG. 1a and FIG. 2. However, this symmetry axis is typically the optical axis of one of the lens sub units. An exemplary embodiment of this arrangement would be shown in FIG. 1b where the optical axis of the middle lens subunit 2 is identical to the symmetry axis of the lens assembly 1.

The lens assemblies in FIGS. 1a and 1b are one-piece assemblies, i.e., they are not separable. In an alternative embodiment of the present invention, the sub units of the multiple lenses are individual components. The term "individual components" indicates that the assembly consists of several parts which are not physically connected to another. This is exemplarily shown in FIG. 2. In one embodiment, the individual sub units are independently addressable. It is possible, but not necessary, to combine the stand-alone lenses physically. This assembly would be still separable if, e.g., a change of the sub unit combination is desired. Furthermore, they may also be electronically linked via, for instance, a controlling unit for the sub units.

In general, the number of lens sub units is typically between 2 to 10, more typically between 2 to 5. Applications with 2 or 3 lens sub units are also very typical. In an application for analyzing vertical structures, for example, two sub units are typical. In three-dimensional imaging applications, it would be possible, for instance, to have three sub units wherein the optical axes of the beams passing through each of them impinges the specimen at 0°, 5° and 20°, or to have five sub units wherein the optical axes of the beams passing through each of them impinges the specimen at −15°, −5°, 0°, 5° and 15°.

Figure 3:
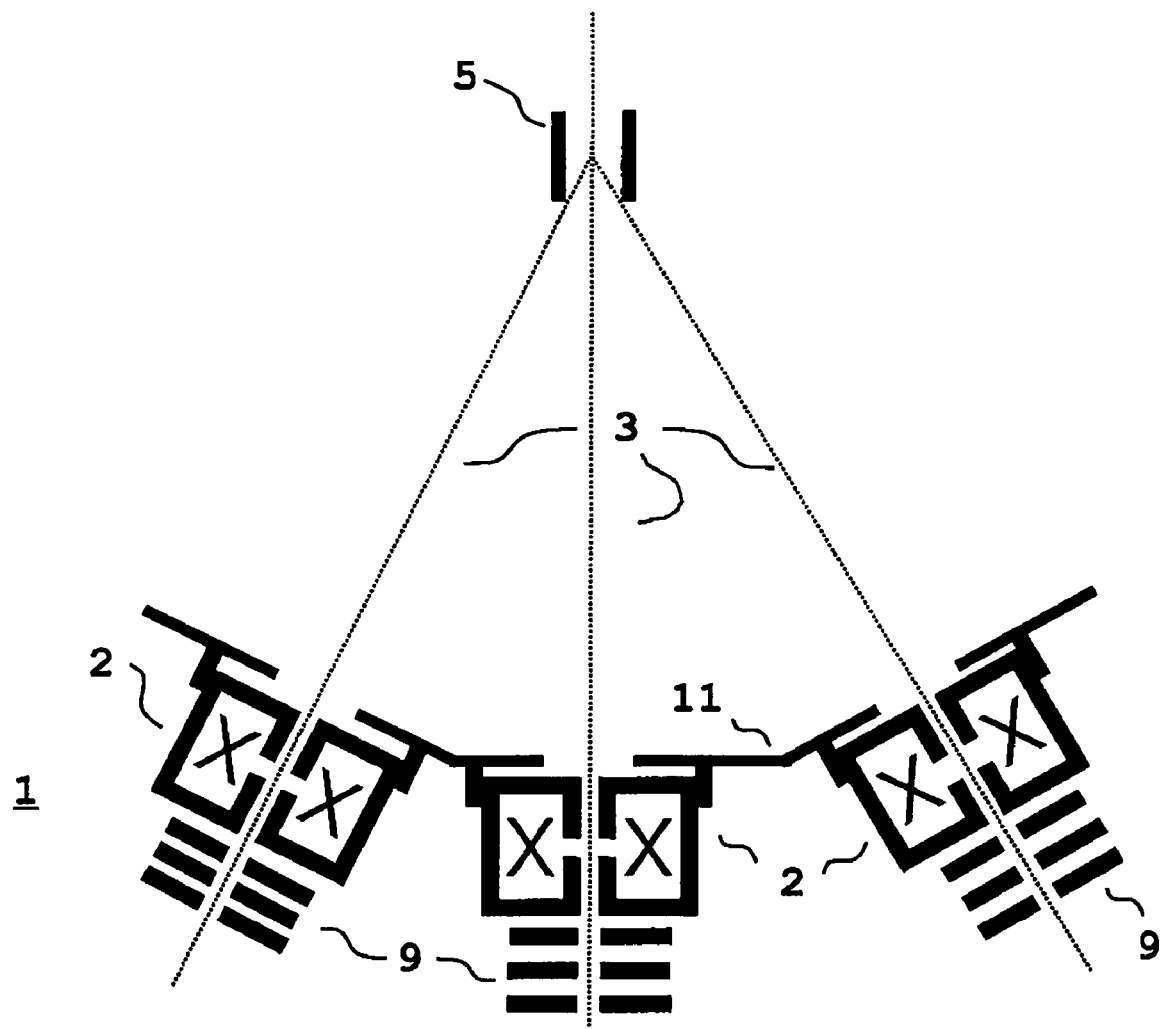
FIG. 3 shows a schematic view of a fourth embodiment of the multiple lens with three magnetic lens sub units.

FIG. 3 is another embodiment of the multiple lens assembly. The lens assembly sub units 2 are magnetic. The sub units are mounted to a common carrier 11. Further to the elements described in connection with FIGS. 1 and 2, a deflector 5 and lenses 9 are shown. An electron beam passing through the deflector 5 is deflected such that the deflected beam propagates along one of the three optical axes 3 depending on the degree and direction of deflection chosen. The deflector 5 does not split the incoming beam. Thus, the charged particle beam current through the deflector 5 and the current through the lens sub unit which the beam is directed through are substantially similar.

In another embodiment (not shown), there is a deflector assembly comprising unit for both splitting and deflecting the beam instead of single deflector 5. That is, the incoming beam is split into two or three different beams each propagating along one optical axis 3 of the respective lens sub units. If not split, the deflected beam passes on its way from the deflector one of the three sub units 2 and one of the additional lenses 9. The lenses 9 are further lenses, for instance, suitable for the correction of aberration or focal length.

That is, in a typical embodiment, the multiple assemblies, according to the present invention, may comprise at least one correction lens. The at least one correction lens is preferably integrated by at least one lens assembly sub unit, but it may also be positioned externally, e.g., directly after the sub unit. In a typical embodiment, each sub unit comprises at least one correction lens. The correction lenses fulfill different purposes: Firstly, they allow the vernier adjustment of the focal width. Secondly, in those embodiments where the electrostatic, magnetic or electromagnetic field strength may be adjusted by the multiple-lens assembly together for all sub units, these correction lenses may be applied in order to have different focal distances of the sub units.

Figure 4:
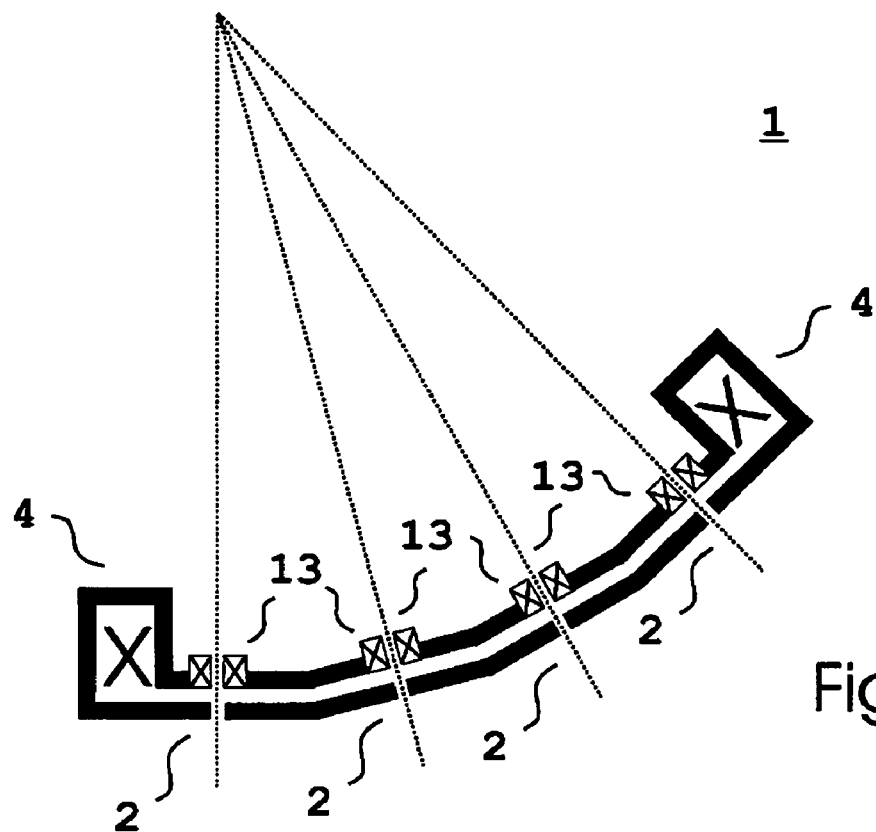
FIG. 4 shows a schematic view of a fifth embodiment of the multiple lens with four magnetic lens sub units.

FIG. 4 shows another embodiment of the multiple lens assembly 1 including four sub units. The lens assembly comprises four optical axes each differing from each other. If used in a charged particle beam device, a specimen table could be mounted under the lens either in a horizontal fashion or in a non-horizontal fashion. In the first case, the beam propagating along the optical axis of the left sub unit would strike the specimen perpendicularly whereas beams propagating along the other optical axes would strike it at smaller angles providing the smallest angle if propagating along the optical axis of the right sub unit. As it is clear for a person skilled in the art, the sub units could also be arranged in such a manner that the distance between each sub unit and specimen would be essentially identical. In the second case there are various kinds of mounting the specimen table. For instance, the table may be raised on the right hand side or on the left hand side. If raised on the left hand side, the differences in the angles at which the beam strikes the specimen increase. Furthermore, the absolute value of the angles at which the beam strikes the specimen increase.

The magnetic lens field is generated by the coil 4 and led to the lens sub unit openings by pole pieces. Furthermore, in the embodiment of FIG. 4 there are also small correction lenses 13 placed within the sub units. The correction lenses are optional; however, they fulfill several purposes: Firstly, they allow the vernier adjustment of the focal width. Secondly, as the magnetic field strength is adjusted commonly for all sub units, these correction lenses 13 may be applied in cases in which the focal distances of the sub units differ. If, for instance, a specimen lies horizontally under the multiple lens, the focal lengths of the four lens sub units according to the embodiment shown in FIG. 4 differ, i.e., the left sub unit has the smallest, the left-middle sub unit has a larger focal width, the right-middle sub unit has a larger width still, and the right sub unit has the largest focal width. Thus, although for all sub units one magnetic main field generated by the coil 4 is applied, different focal lengths for different lens assembly sub units can be adjusted.

Figure 5:
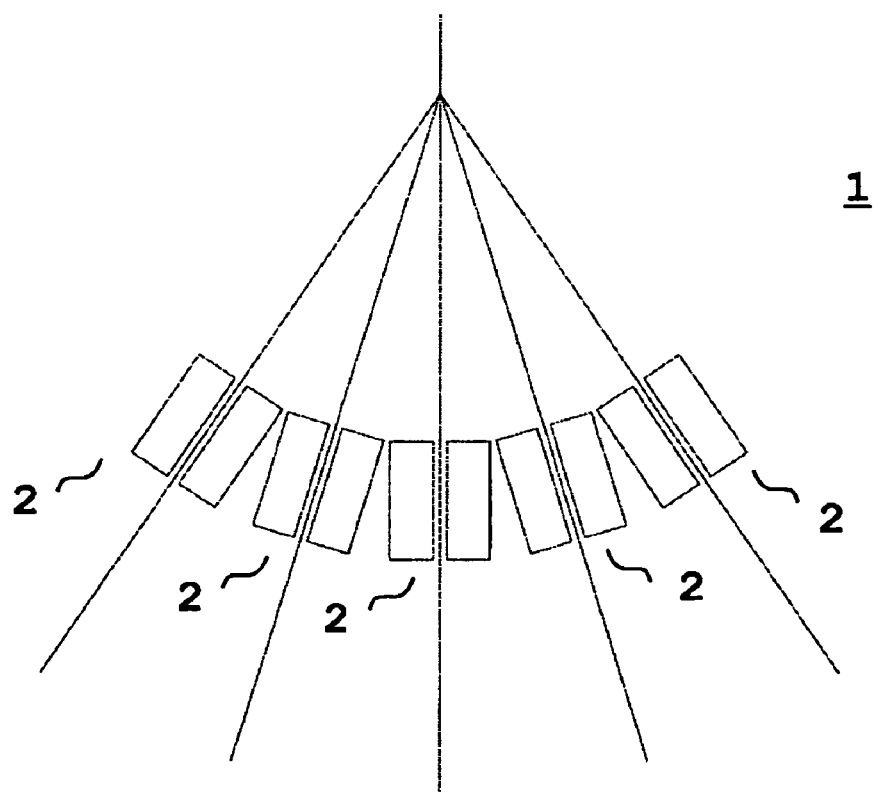
FIG. 5 shows a schematic view of a sixth embodiment of the multiple lens with five lens sub units.

FIG. 5 is an embodiment showing the multiple-lens assembly 1 comprising five sub units. The lens sub 2 units are schematically shown as rectangles.

Figure 6A:
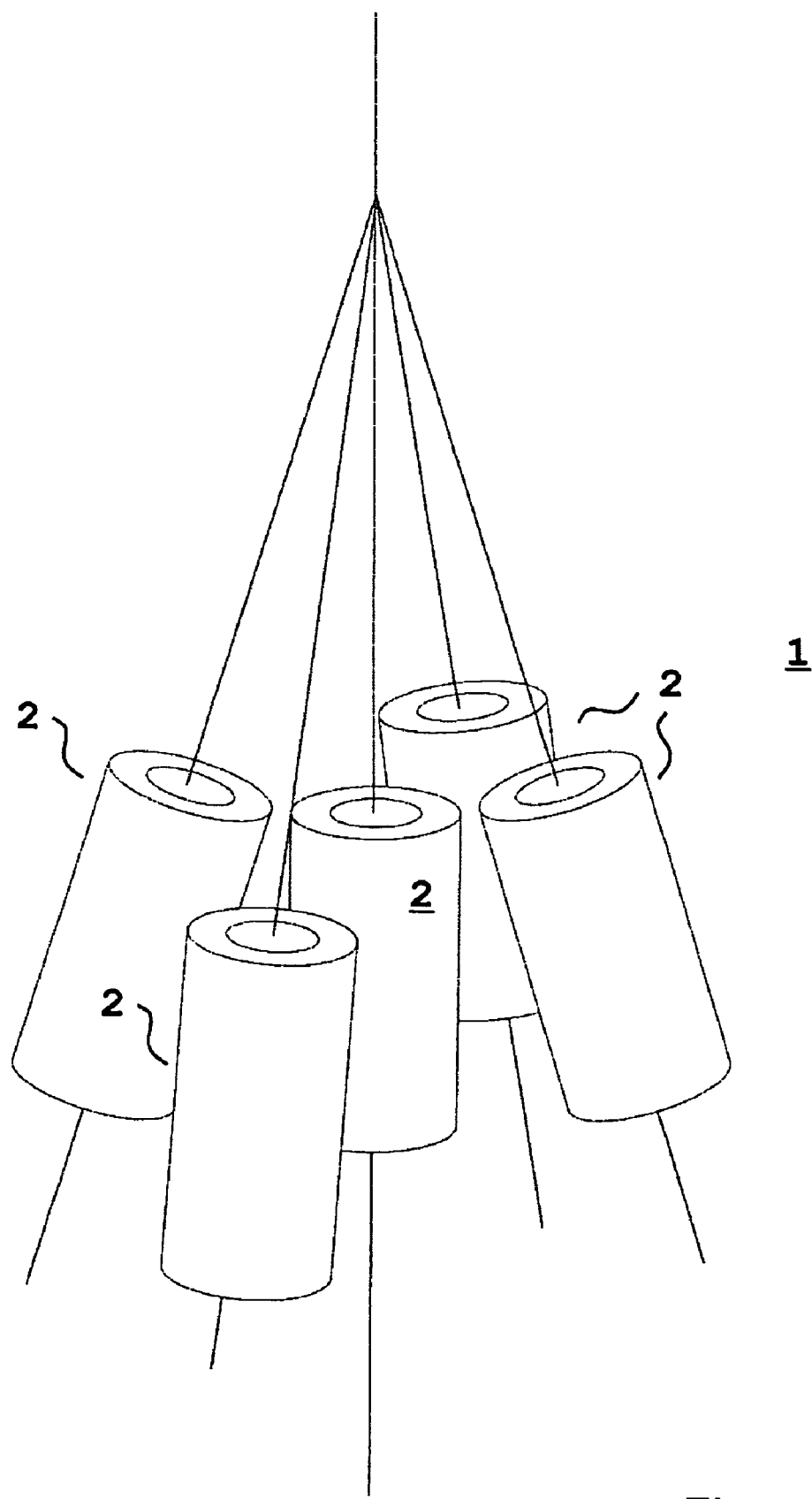
FIG. 6a shows a schematic view of a seventh embodiment of the multiple lens with five magnetic lens sub units.

FIG. 6a shows another embodiment of the multiple lens according to the invention in a 3-dimensional view.

Figure 6B:
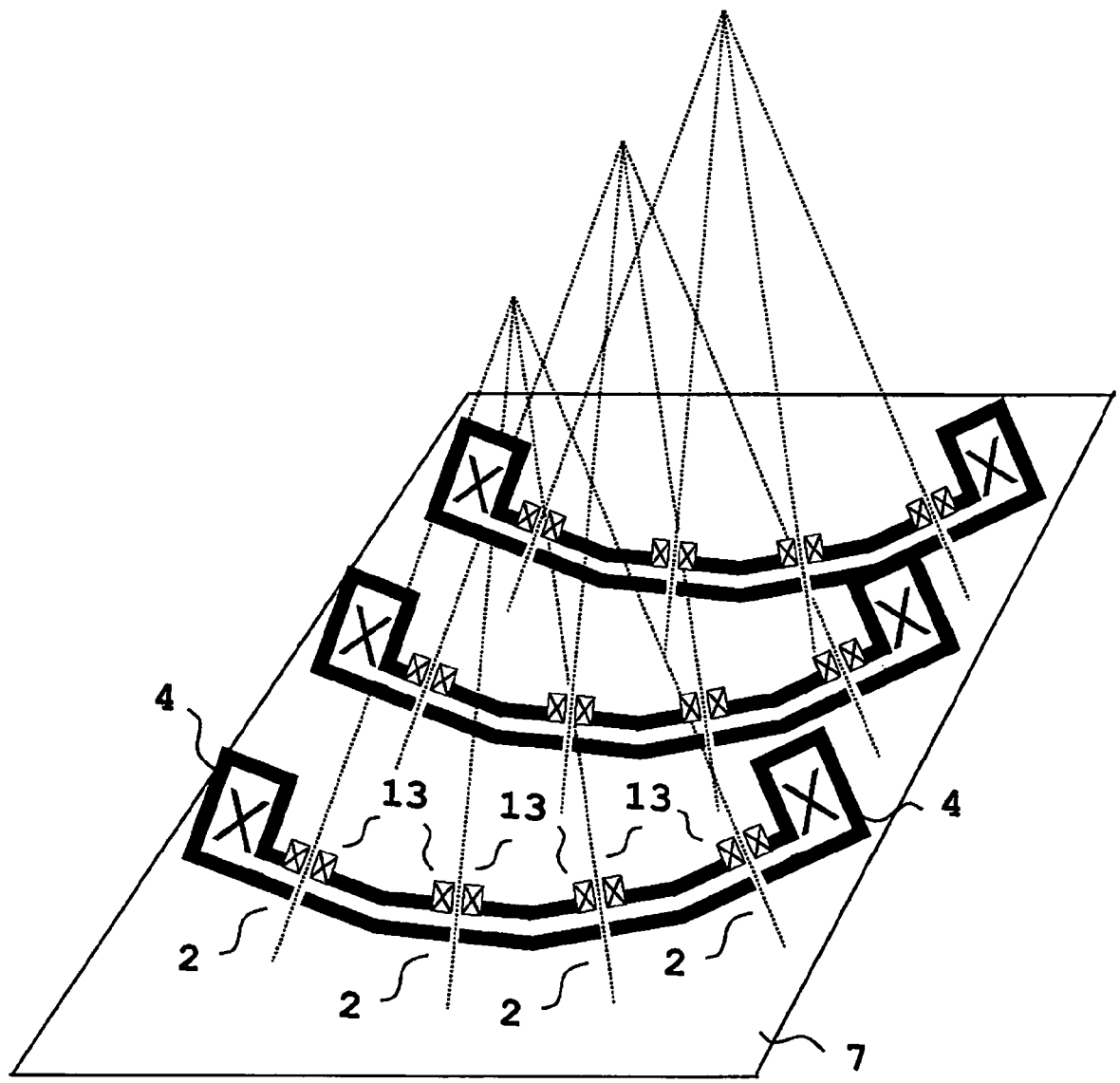
FIG. 6b shows a schematic view of an eighth embodiment of the multiple lens assembly arranged in an array fashion.

The lens sub units are e.g. magnetic coils. However, they could be electrostatic or compound electrostatic magnetic as well. They are arranged such that the optical axes they define meet at one point which could, for instance, be the position of a deflector. As shown in the figure, the sub units can be arranged in a three-dimensional space, that is, they do not necessarily need to be arranged in a single plane. They may also be arranged array shaped as shown in FIG. 6b whereas 7 refers to a specimen to be inspected.

Figure 7:
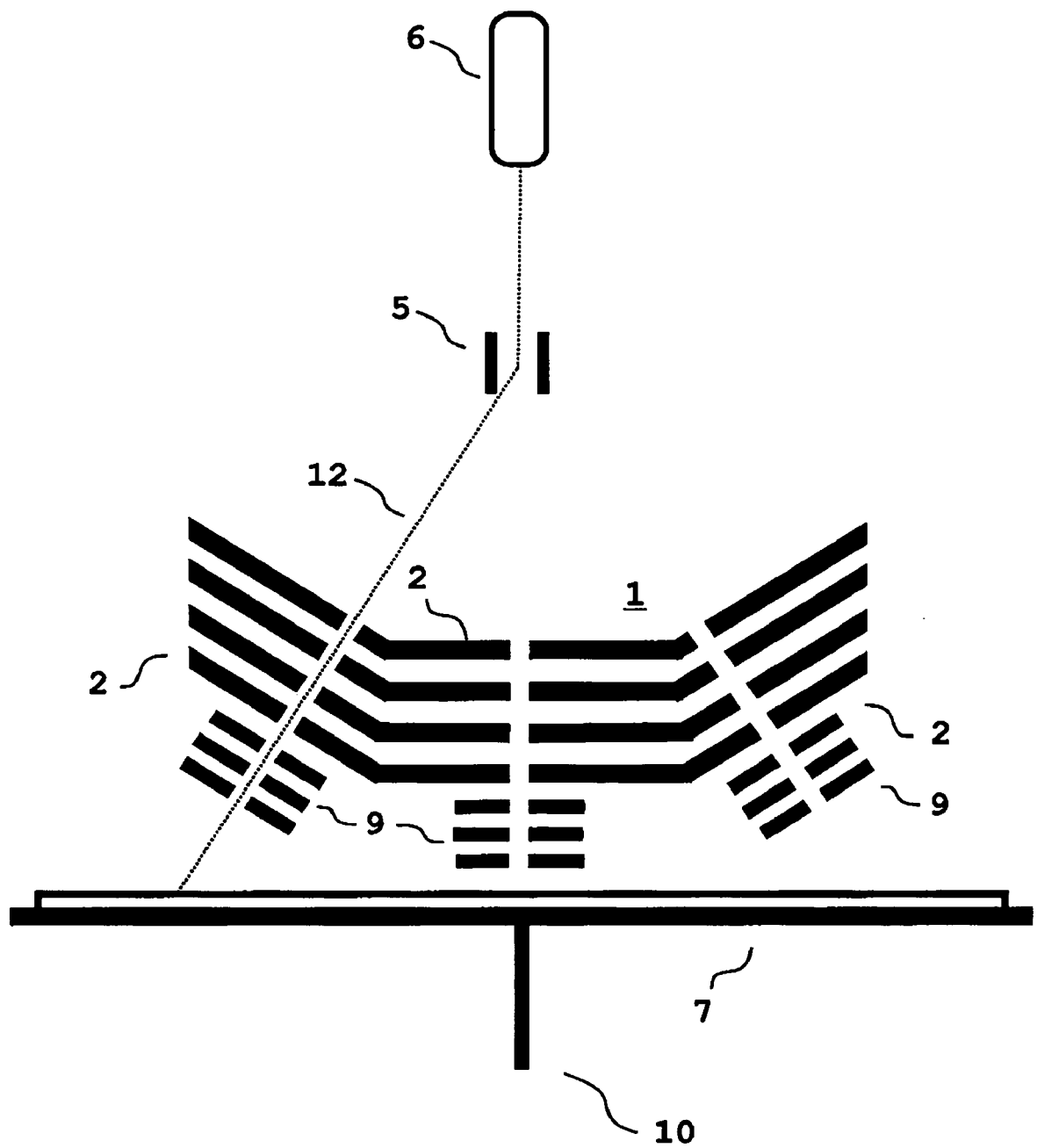
FIG. 7 shows a schematic view of a first embodiment of the charged particle beam device comprising electrostatic lens sub units.

FIG. 7 is an embodiment of a charged particle beam device. The device comprises an electrostatic multiple lens assembly 1 with four electrodes, having sub units 2 whereas the optical axes thereof are not shown. Instead, the charged particle beam 12 is shown. The particle beam is emitted from the particle beam emitter 6 and further deflected by the deflector 5.

In general, the charged particle beam device according to the present invention comprises preferably a deflection assembly with at least one deflection unit suitable for deflecting a charged particle beam such that it propagates substantially along the optical axis of one of the lens sub units. For instance, the deflection may be carried out by a system of multipoles or by a system of sector fields. The use of multipoles is typical for small deflection angles such as 0°-20°, whereas in the case of large deflection angles, such as 20° and more, it is typical to apply sector fields. The deflector may be electrostatic, magnetic or compound electrostatic magnetic.

Hence, in FIG. 7, the deflected beam 12, exemplary shown as deflected along the optical axis of the left lens assembly sub unit 2, passes through the sub unit and further through the additional lens 9 until it impinges on the specimen 7 under an angle not perpendicular to the specimen plane. Regarding the scanning of the beam, the positioning of a scanning unit as shown in FIGS. 9a-9d is possible. The specimen 7, e.g. a semiconductor chip, rests on a specimen table 10. In general, the specimen table may be movable and/or tiltable.

For process economics reasons, it may be useful to have more than one beam impinging on the specimen at one time when employing the charged particle beam device according to the present invention. In order to do so, there are two possibilities: Firstly, the deflector assembly acts as a splitting deflector assembly, i.e. the incoming beam is split and the at least two resulting beams are directed to different lens sub units. Splitting could e.g. be performed by widening the beam and guiding the expanded beam through at least two aperture openings. Secondly, there are at least two different beams arriving at the deflector assembly and each beam is deflected to another lens sub unit. Combinations thereof are also possible.

Furthermore, it is typical that the deflection system of the charged particle beam according to the present invention is essentially positioned at the intermediate image (crossover) of the particle emitter. Making use of this embodiment the aberration can be minimized. This is particularly true in the case of large deflection angles such as 35°, 40° or 45°.

The charged particle beam device according to the present invention may comprise further optical elements such as further lenses, condensers, apertures, beam alignment components or other components for guiding and shaping a charged particle beam. These additional optical elements are preferably positioned such that the optical axis thereof coincides with the optical axis of at least one of the lens sub units. Besides, the additional elements, in particular the further lenses, are preferably positioned between the respective lens sub unit and the specimen plane.

Figure 8:
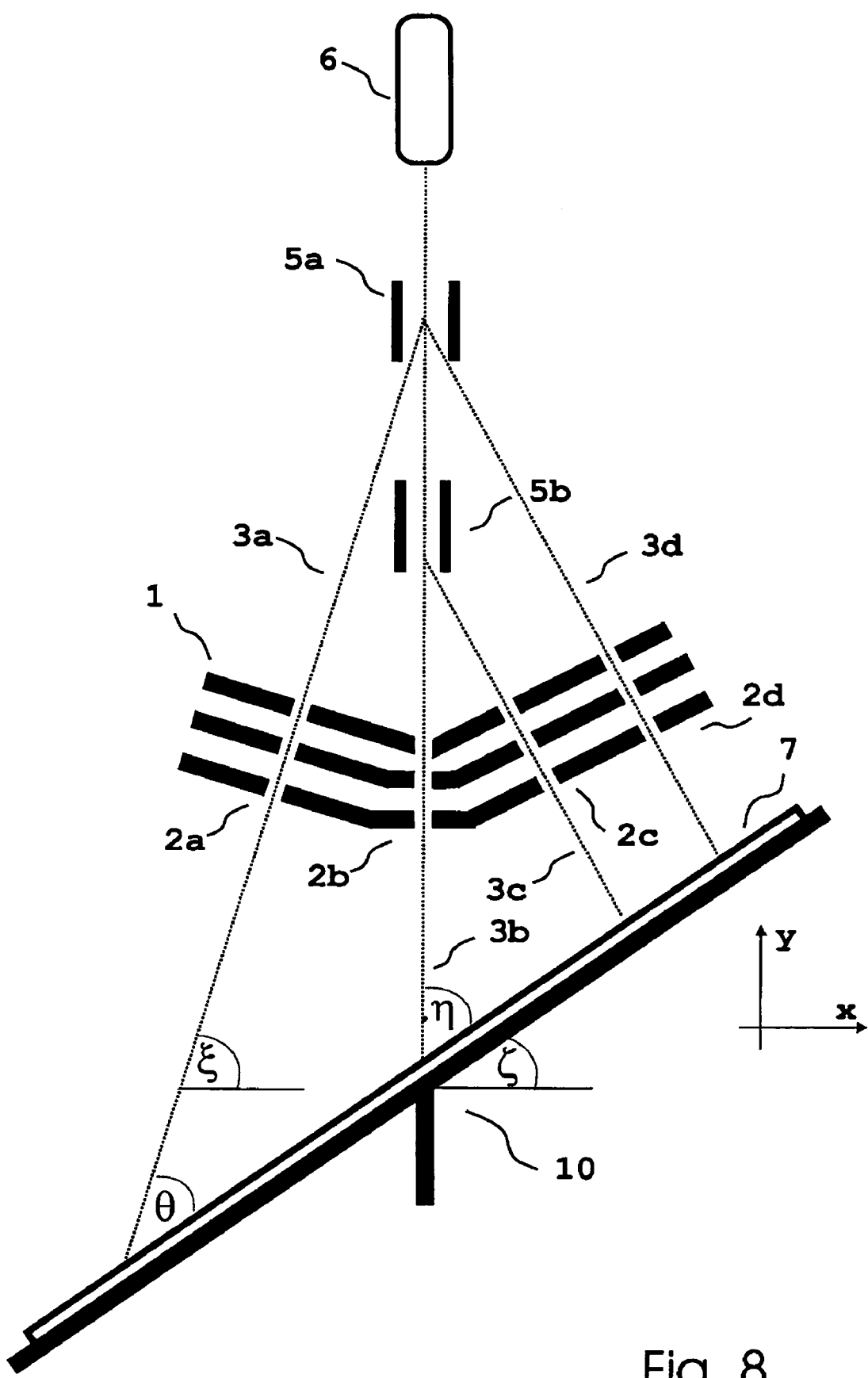
FIG. 8 shows a schematic view of a second embodiment of the charged particle beam device comprising four electrostatic lens sub units.

FIG. 8 shows another embodiment of the charged particle beam device. The multiple lens assembly has four sub units 2a, 2b, 2c, 2d whose optical axes provide three different angles to the specimen plane. Further to that, in FIG. 8 the specimen 7 is tilted at an angle of ζ. This could relate to a situation in which the specimen table remains tilted at a specific angle during the whole analyzing procedure or to a situation in which the specimen table is tilted to different angles during the analysing procedure.

In FIG. 8 a beam passing through the right sub units 2c, 2d strikes the specimen almost perpendicularly, a beam passing through the sub unit 2b at an angle of η, and a beam passing through the left sub unit 2a at an angle of θ. That is, in the embodiment shown in FIG. 8 two effects are exploited: Firstly, the specimen plane is tilted. However, the tilting is practically limited as it is well known for those skilled in the art. Secondly, the beam is deflected and passes through one of the sub units. Thus, if passing through the sub units 2c or 2d, it strikes the specimen perpendicularly. If passing through sub unit 2b, the resulting strike angle is η which is obviously 90°−ζ where ζ is the tilt angle of the specimen table. If passing through sub unit 2a, the resulting angle is θ=ξ−ζ. That is, the specimen can be examined without further tilting of the specimen table or the charged particle beam device at three different angles 90°, ζ and θ, wherein the last one, θ, is definitely smaller than a maximally achievable tilting angle of the specimen table. It may be added that the smallest resulting angle between the beam and the specimen plane achievable in the case of a horizontal orientated specimen plane, i.e. without tilting the specimen, would be between the optical axes 3c and 3d, respectively, of the right sub units 2c and 2d, respectively, and the specimen table.

In FIG. 8 there are shown two possibilities of deflecting at different angles. These techniques may be used alternatively or together. The first technique is to use a first deflector 5a for deflecting the beam to the sub units 2a, 2b and 2d. As shown in the figure, the deflector is capable of both deflecting the incoming beam at smaller angles, e.g. to sub unit 2a, at larger angles, e.g. to sub unit 2d, and of not deflecting at all, which refers to the case in which the beam passes deflector 5a without any change of direction. Therefore, with the deflector 5a and the multiple lens assembly 1, the specimen can be analyzed at three different angles.

As a further embodiment, in FIG. 8 there is shown an additional deflector 5b which allows the deflection of the beam passed straightforwardly in deflector 5a. Exemplarily, the deflection in deflector 5b results in a beam whose propagation direction 3c is parallel to the propagation direction 3d of the beam deflected to sub unit 2d by the first deflector 5a. However, this can be varied in accordance with the alignment of the respective lens assembly sub units. For instance, if the optical axis 3c of sub unit 2c is slightly twisted, the charged particle beam shown in the figure could be used for analyzing a specimen under four different angles without tilting the specimen or the apparatus itself.

In general, for the purpose of analyzing a specimen (or also called "sample"), it is typical that at least one sub unit has an optical axis that is perpendicular to the specimen plane. Because at least two of the optical axes of the lens sub units according to the invention are inclined, at least one sub unit has an optical axis that is not perpendicular to the specimen plane. Thus, with the charged particle beam device as described, a three-dimensional imaging of the specimen can be conducted.

In one embodiment the specimen is analyzed under at least three different angles, e.g. by employing a charged particle beam device with three lens sub units as shown in FIG. 7, where each lens sub unit has an optical axis that differs from the optical axis of at least two other sub units, or by employing a charged particle beam device with four or more lens sub units. As shown in FIG. 8, in this case, a part of the sub units may have parallel optical axes. The term "different optical axis" expresses that the space orientation of the optical axes differs. If there are four or even more sub units comprised in the multiple lens assembly, in one embodiment, every sub unit has a different optical axis. Thus, if a beam is sequentially or contemporarily deflected to n lens assembly sub units, there are n different angles under which the beam impinges on the specimen.

In one embodiment, each lens sub unit has an optical axis that forms an angle of between 0° and 60° to the perpendicular of the specimen plane. Typically, one optical axis of one lens sub unit forms an angle of between 0° and 10° to the perpendicular of the specimen, and the optical axis of another lens sub unit forms an angle of between 45°±15° to the perpendicular of the specimen plane. In another embodiment, the optical axes of the lens sub units form an angle of between 0° and 25° to the perpendicular of the specimen plane. Typically, the optical axis of one lens sub unit forms an angle of between 0° and 10°, e.g. 5°, to the perpendicular of the specimen plane and the optical axis of another lens sub unit forms an angle of between 10° and 25°, e.g. 15°, to the perpendicular of the specimen plane. Larger angles can be achieved by exploiting one or both of the following two effects: Firstly, the optical axes of the sub units can be strongly inclined compared to the horizontal plane (the so-called x-y-plane). Secondly, the specimen can be tilted itself. Combining both effects, the charged particle beam device can be operated at large angles. FIG. 8 shows exemplarily the case in which both the specimen and the optical axes are inclined.

With respect to the angles the following difference should be noted: The angles as described in the last paragraph refer to angles between the optical axes and the perpendicular of the sample plane. These angles are often called "tilt angles". That is, an angle of 0° refers to an optical axis or a beam that meets the specimen perpendicularly. However, in the state of the art it is also common to specify an angle between beam direction or optical axis and the surface of the specimen. In this case, the angle 90° refers to an optical axis or beam that impinges the specimen perpendicularly.

In one aspect of the present invention, the charged particle beam device comprises a scanning assembly suitable for scanning the charged particle beam and preferably positioned before the deflection system, i.e. somewhere between emitter and deflector assembly. For example, the scanning assembly (or scanning system) can be positioned directly upstream of the deflection system. The terms "upstream" and "downstream" in this context refer to the position as seen in beam direction. That is, an optical element a particle passes at an earlier time is positioned "upstream" of an optical element the particle passes at a later time.

Figure 9A:
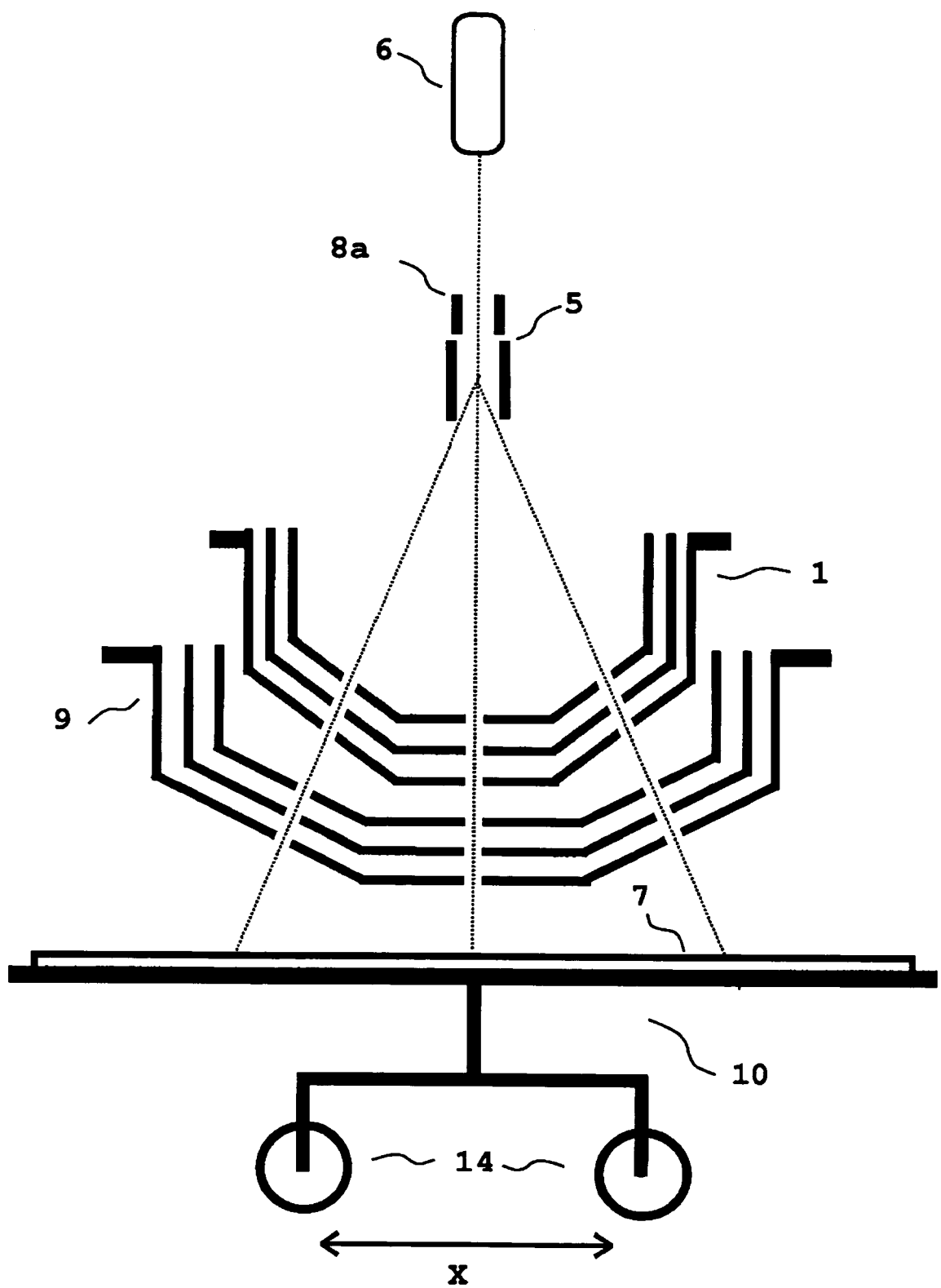
FIGS. 9a-d show further embodiments of the charged particle beam device comprising multiple lens assemblies.
Figure 9B:
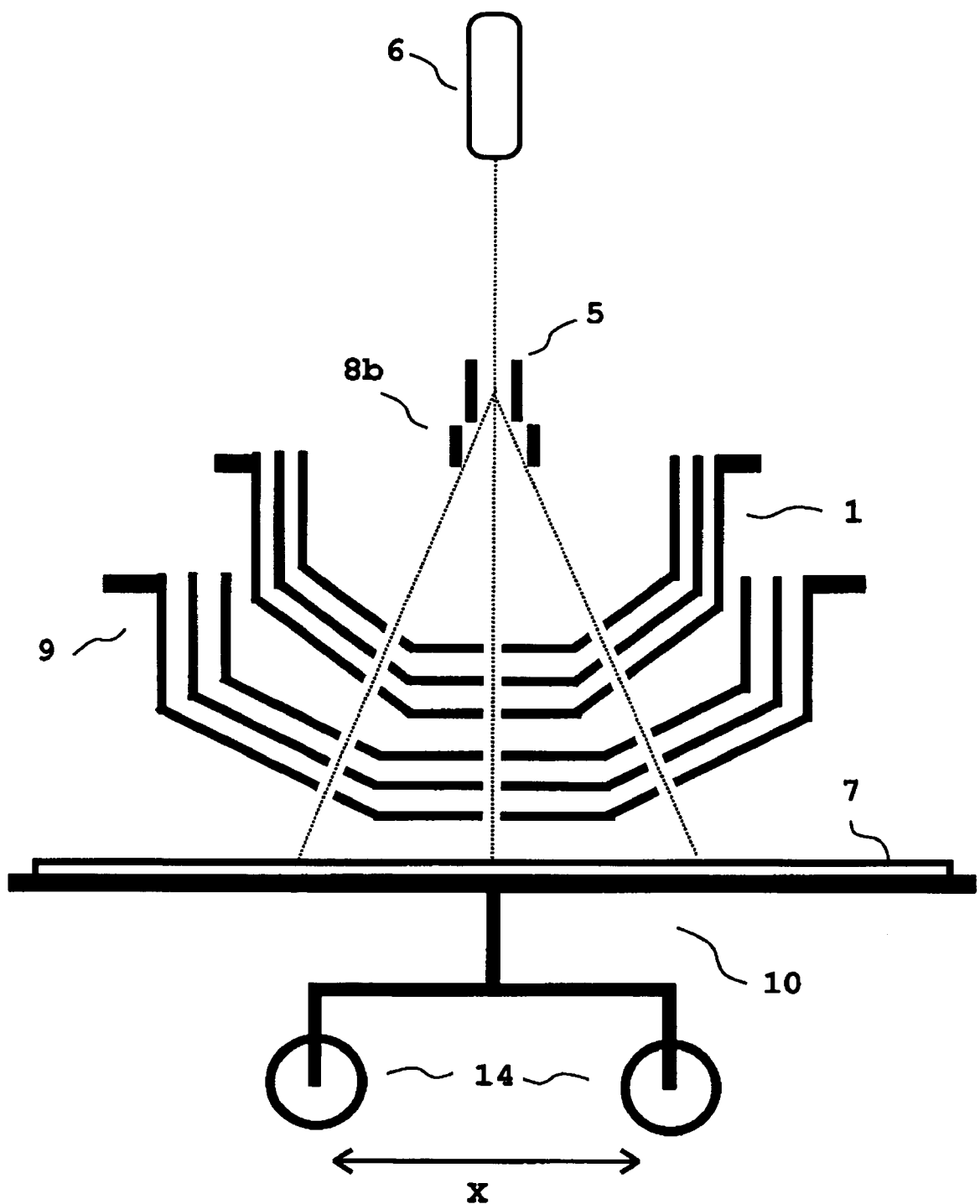

FIGS. 9a-9d show different possibilities of positioning the scanning elements. In the embodiment described, one common scanning element is used for scanning the beam regardless of which lens sub unit it is deflected to. This can be accomplished by a scanning element 8a directly upstream of the deflector 5 (cp. FIG. 9a). However, the scanning element 8b may be positioned directly downstream of the deflector as shown in FIG. 9b.

Alternatively or additionally, a scanning assembly is positioned upstream or downstream of the multiple lens assembly. For instance, there is one scanning unit placed upstream or downstream of each lens assembly sub unit. If there is e.g. a further lens between the multiple lens assembly and the specimen, the scanning unit could be positioned downstream of the additional lens and thus, also downstream of the multiple lens assembly. Especially in those embodiments where the beam is split and subsequently deflected to different sub units, it is desirable to have different scanning units in order to address them independently.

Figure 9C:
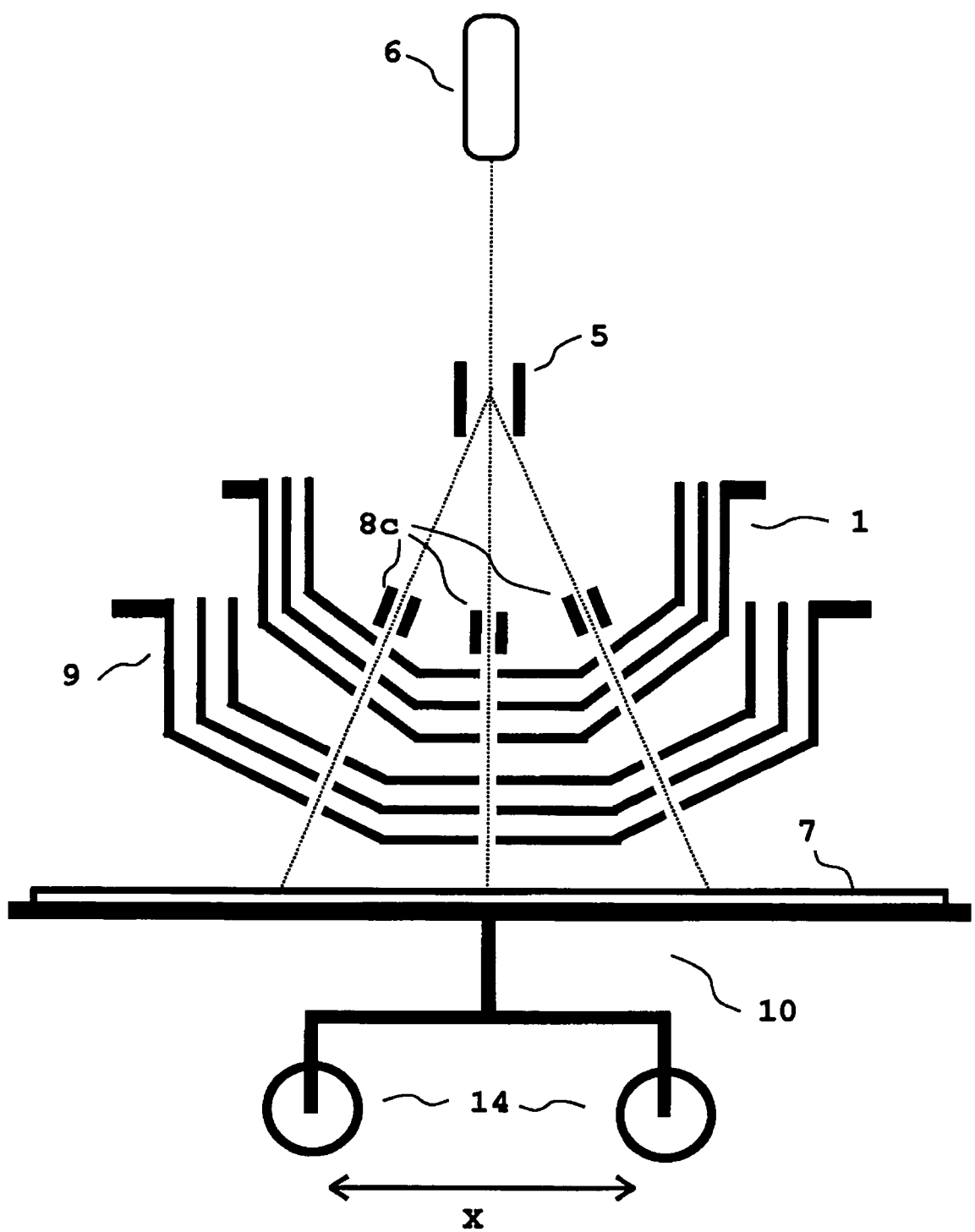

In FIG. 9c, the scanning elements 8c are positioned such that before each lens assembly sub unit there is placed one scanning element. Of course this can be varied such that the individual scanning elements 8c could be placed anywhere between the deflector 5 and the multiple lens assembly 1.

Figure 9D:
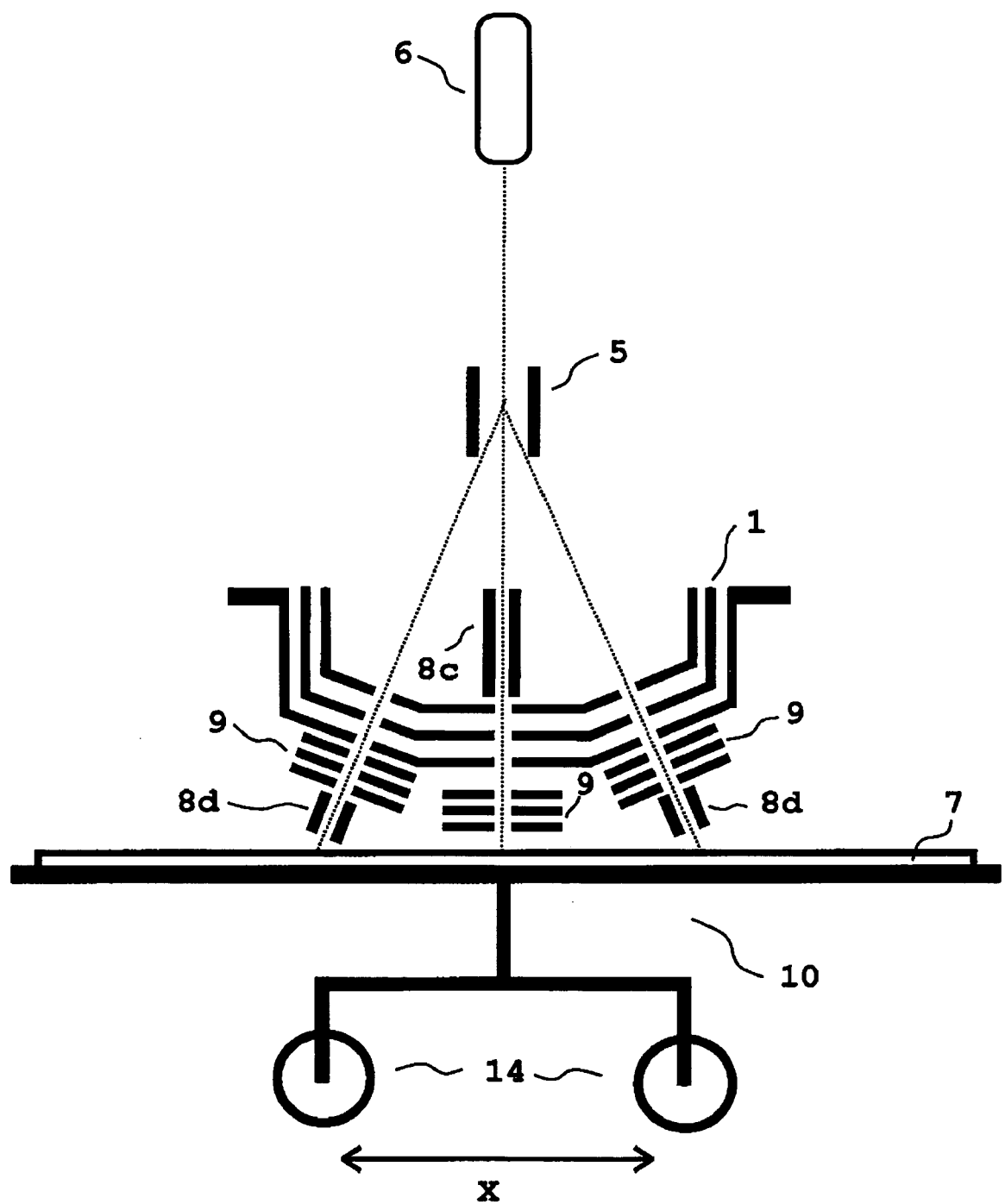

In an alternative embodiment, the scanning elements can be placed downstream of the lens assembly sub units. Moreover, they can be positioned downstream of additional lenses, such as additional objective lenses which themselves are downstream of the lens assembly. In FIG. 9d the scanning elements 8d are positioned directly upstream of the specimen 7. A scanning element 8d could be downstream of each sub unit. However, as it is shown in FIG. 9d, it is also possible to place the respective scanning systems 8d of a part of the lens assembly sub units downstream of the sub units and another part of the lens assembly sub units 8b upstream of the sub units.

The various possibilities of placing the scanning elements as described herein and in particular with regard to FIGS. 9a-d are also applicable in the context of the other figures. In general, it is typical that there is one common scanning unit in the case of smaller deflection angles and that there are as many individual scanning units as sub units in the case of larger deflection angles. Dependent on the lens geometry, the scanning unit can also be positioned within the individual lens sub units.

The same is true for the detection system. A detection assembly may be positioned between the additional lens and the specimen, between the multiple lens assembly and the deflector or between the deflector and the particle beam emitter. The detection system may consist of one detection element capable of detecting the particle beam regardless of which lens sub unit it passed through, or of more detection elements, for instance one detection element per lens sub-unit.

The embodiments depicted in FIGS. 9a-9d show the optional lens 9 as an electrostatic multiple lens assembly. This shows that the multiple lens assembly can be used in various ways. In particular, according to the charged particle beam device of the present invention it is possible to place several multiple lenses in a row. Besides, the little rolls 14 in FIGS. 9a-9d are depicted to indicate that the specimen table may not only be tiltable but movable in the x-direction, too. For a person skilled in the art, it will be clear that the unit for moving the specimen table is optional.

The invention claimed is:

1. A charged particle beam device, comprising:
a multiple lens assembly, comprising at least two physically round lens sub-units, each lens sub-unit defining a round lens field, each lens sub-unit having an optical axis defined by individual lens sub-unit openings, wherein at least two of the optical axes of the lens sub-units are inclined to each other such that a charged particle beam passing through one of the at least two lens sub-units strikes a specimen at a first angle to the specimen plane, and a charged particle beam passing through another one of the at least two lens sub-units strikes the specimen at a second angle to the specimen plane, the second angle being different from the first angle, wherein the at least two lens sub-units are laterally spaced apart; and
a deflection system which comprises at least one deflection unit suitable for deflecting a charged particle beam such that it propagates substantially along the optical axis of one of the lens sub-units; wherein the multiple lens assembly is a one-piece assembly that is positioned downstream of the deflection system.

2. The charged particle beam device according to claim 1, wherein the optical axes of the lens sub-units are inclined by an angle of between 5° and 25°.

3. The charged particle beam device according to claim 1, wherein the optical axes of the lens sub-units are inclined by an angle of between 30 and 60 degrees.

4. The charged particle beam device according to claim 1, wherein the multiple-lens assembly is an electrostatic lens.

5. The charged particle beam device according to claim 1, wherein the multiple-lens assembly is a magnetic lens.

6. The charged particle beam device according to claim 1, wherein the multiple-lens assembly is a compound electrostatic magnetic lens.

7. The charged particle beam device according to claim 1, wherein the lens sub-units are arranged symmetrically to an axis.

8. The charged particle beam device according to claim 1, wherein the number of lens sub-units is from 2 to 5.

9. The charged particle beam device according to claim 1, wherein each lens sub-unit comprises a correction lens.

10. The charged particle beam device according to claim 1, having at least three lens sub-units wherein none of the optical axes of the at least three lens sub-units is parallel to the optical axis of another lens sub-unit.

11. The charged particle beam device according to claim 1, comprising one charged particle beam emitter.

12. The charged particle beam device according to claim 11, wherein there is no substantial beam current through all but one lens sub-unit.

13. The charged particle beam device according to claim 1, wherein the beam current through the deflection system is substantially identical to the beam current through one lens sub-unit.

14. The charged particle beam device according to claim 13, wherein the deflection is carried out by a system of multipoles.

15. The charged particle beam device according to claim 14, wherein the position of the deflection system is essentially at an intermediate image of a particle emitter.

16. The charged particle beam device according to claim 1, comprising at least one additional optical element positioned such that the optical axis thereof coincides with the optical axis of at least one of the lens sub-units.

17. The charged particle beam device according to claim 1, wherein at least one lens sub-unit has an optical axis that is perpendicular to a specimen plane.

18. The charged particle beam device according to claim 1, wherein each lens sub-unit has an optical axis that forms an angle of between 0° and 60° to the perpendicular of a specimen plane.

19. The charged particle beam device according to claim 18, wherein the optical axis of one lens sub-unit forms an angle of between 0° and 5° to the perpendicular of the specimen plane and the optical axis of another lens sub-unit forms an angle of between 35° and 60° to the perpendicular of the specimen plane.

20. The charged particle beam device according to claim 18, wherein each lens sub-unit has an optical axis that forms an angle of between 0° and 25° to the perpendicular of the specimen plane.

21. The charged particle beam device according to claim 18, wherein the optical axis of one lens sub-unit forms an angle of between 0° and 10°, and the optical axis of another lens sub-unit forms an angle of between 10° and 25° to the perpendicular of the specimen plane.

22. The charged particle beam device according to claim 1, comprising a scanning system suitable for scanning the charged particle beam.

23. The charged particle beam device according to claim 1, comprising a scanning system which comprises scanning units positioned upstream or downstream of the lens sub-unit.

24. The charged particle beam device according to claim 13, wherein the deflection is carried out by a system of sector fields.

25. The charged particle beam device according to claim 14, wherein the deflection is carried out by the system of multipoles and a system of sector fields.

26. The charged particle beam device according to claim 1, wherein the at least two lens sub-units are adjusted uniformly for all sub-units.

27. The charged particle beam device according to claim 1, wherein charged particle beams pass through each of the at least two lens sub-units along their respective optical axis.

28. The charged particle beam device according to claim 1, wherein the lens sub-units are spaced apart to be horizontally displaced.

29. The charged particle beam device according to claim 1, wherein the multiple lens assembly comprises one of: two, three or four electrodes;

or one pair of pole pieces.

* * * * *

UNITED STATES PATENT AND TRADEMARK OFFICE
CERTIFICATE OF CORRECTION

| | | |
|---|---|---|
| PATENT NO. | : 7,928,403 B2 | Page 1 of 1 |
| APPLICATION NO. | : 11/323017 | |
| DATED | : April 19, 2011 | |
| INVENTOR(S) | : Adamec | |

It is certified that error appears in the above-identified patent and that said Letters Patent is hereby corrected as shown below:

In the Claims:

Column 12, Claim 12, Line 52, please delete "11" and insert --1-- therefor.

Signed and Sealed this
Fifth Day of July, 2011

David J. Kappos
*Director of the United States Patent and Trademark Office*